(12) United States Patent
Weijden et al.

(10) Patent No.: US 11,372,338 B2
(45) Date of Patent: Jun. 28, 2022

(54) METHOD FOR EVALUATING CONTROL STRATEGIES IN A SEMICONDUCTOR MANUFACTURING PROCESS

(71) Applicant: ASML NETHERLANDS B.V., Veldhoven (NL)

(72) Inventors: Ivo Matteo Leonardus Weijden, Eindhoven (NL); Jeroen Van Dongen, Houten (NL); Cornelis Johannes Henricus Lambregts, Geldrop (NL); Theo Wilhelmus Maria Thijssen, Eindhoven (NL); Ruud Rudolphus Johannes Catharinus De Wit, Susteren (NL); Hans Marinus Struijs, Eindhoven (NL); Erik Mathijs Maria Crombag, Eindhoven (NL); Roy Werkman, Eindhoven (NL); Maria Helena Schut, Nuenen (NL); Erwin Riemens, Eindhoven (NL); Menno Meeldijk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 87 days.

(21) Appl. No.: 16/979,056

(22) PCT Filed: Feb. 13, 2019

(86) PCT No.: PCT/EP2019/053535
§ 371 (c)(1),
(2) Date: Sep. 8, 2020

(87) PCT Pub. No.: WO2019/185233
PCT Pub. Date: Oct. 3, 2019

(65) Prior Publication Data
US 2020/0401052 A1    Dec. 24, 2020

(30) Foreign Application Priority Data

Mar. 29, 2018 (EP) .................................. 18165064
Oct. 1, 2018 (EP) .................................. 18197856

(51) Int. Cl.
*G03F 7/20* (2006.01)
*G01N 21/95* (2006.01)
(Continued)

(52) U.S. Cl.
CPC ..... *G03F 7/70525* (2013.01); *G01N 21/9501* (2013.01); *G03F 7/70616* (2013.01); *G03F 9/7092* (2013.01); *H01L 22/12* (2013.01)

(58) Field of Classification Search
CPC ............ G03F 7/70491; G03F 7/70525; G03F 7/70616; G03F 9/7092; G01N 21/9501; H01L 22/12; H01L 22/20
See application file for complete search history.

(56) References Cited

U.S. PATENT DOCUMENTS 6,477,432 B1   11/2002   Chen et al.
6,937,914 B1   8/2005    Bode et al.
(Continued)

FOREIGN PATENT DOCUMENTS

WO   2009078708   6/2009
WO   2009106279   9/2009
(Continued)

OTHER PUBLICATIONS

International Search Report and Written Opinion issued in corresponding PCT Patent Application No. PCT/EP2019/053535, dated May 31, 2019.
(Continued)

*Primary Examiner* — Peter B Kim
(74) *Attorney, Agent, or Firm* — Pillsbury Winthrop Shaw Pittman LLP

(57) ABSTRACT

A method for determining a preferred control strategy relating to control of a manufacturing process for manufacturing an integrated circuit. The method includes: obtaining process data associated with a design of said integrated circuit; and obtaining a plurality of candidate control strategies configured to control the manufacturing process based on the process data, each candidate control strategy including an associated cost metric based on an associated requirement to implement the candidate control strategy. A quality metric related to an expected performance of the manufacturing process is determined for each candidate control strategies, and a preferred control strategy is selected based on the determined quality metrics and associated cost metrics for each candidate control strategy.

22 Claims, 4 Drawing Sheets

(51) Int. Cl.
*G03F 9/00* (2006.01)
*H01L 21/66* (2006.01)

(56) References Cited

U.S. PATENT DOCUMENTS

| | | |
|---|---|---|
| 2005/0203858 A1* | 9/2005 | Tai .................. G06Q 30/0283 |
| | | 705/400 |
| 2006/0033921 A1 | 2/2006 | Den Boef et al. |
| 2006/0066855 A1 | 3/2006 | Boef et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2018/0046737 A1 | 2/2018 | Willems et al. |

FOREIGN PATENT DOCUMENTS

| | | |
|---|---|---|
| WO | 2013178422 | 12/2013 |
| WO | 2017108453 | 6/2017 |

OTHER PUBLICATIONS

Extended European Search Report Opinion issued in corresponding European Patent Application No. 19156892.2, dated Aug. 28, 2019.

\* cited by examiner

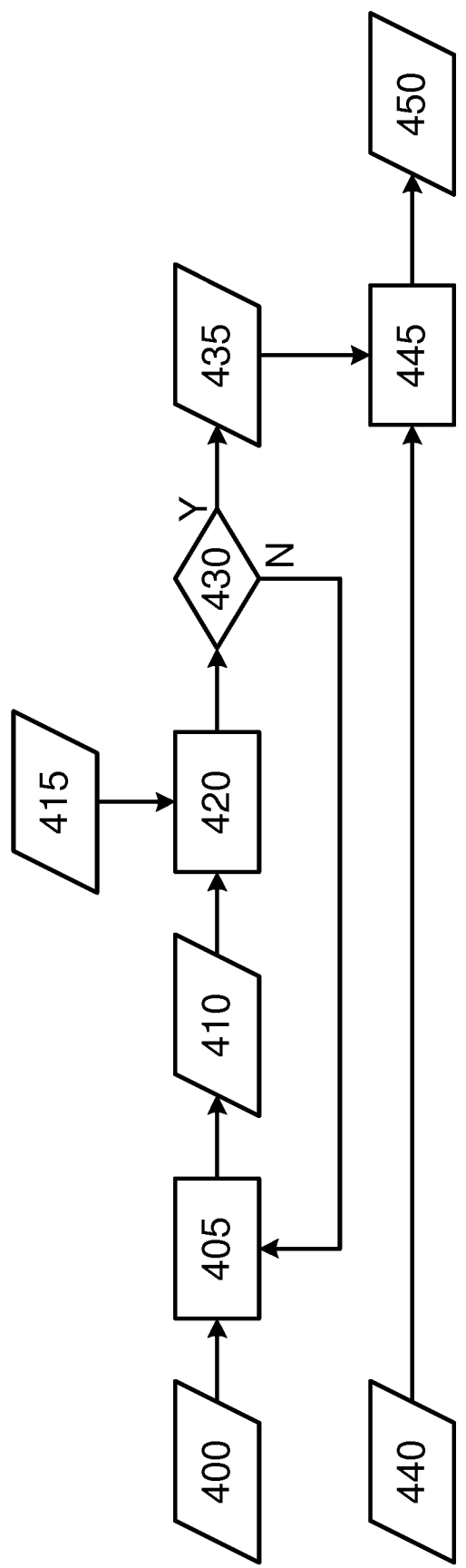

METHOD FOR EVALUATING CONTROL STRATEGIES IN A SEMICONDUCTOR MANUFACTURING PROCESS

CROSS-REFERENCE TO RELATED APPLICATIONS

This application is the U.S. national phase entry of PCT patent application no. PCT/EP2019/053535, which was filed on Feb. 13, 2019, which claims the benefit of priority of European patent application no. 18165064.9 which was filed on Mar. 29, 2018 and of European patent application no. 18197856.0 which was filed on Oct. 1, 2018, which are incorporated herein in their entireties by reference.

BACKGROUND

Field of the Invention

The present invention relates to methods and apparatus for applying patterns to a substrate in a lithographic process and/or measuring said patterns.

Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing semiconductor manufacturing processes, such as application of a pattern on a substrate or measurement of such a pattern, process control methods are used to monitor and control the process. Such process control techniques are typically performed based on a control strategy so as to obtain corrections for semiconductor manufacturing processes based on a metrology effort. By increasing the metrology effort, in principle, better corrections and control can be achieved (within limits). However, metrology takes time and therefore will effect throughput, productivity and therefore profitability of a manufacturing process.

It would be desirable to provide a method and/or tool for better evaluating control strategies.

SUMMARY OF THE INVENTION

In a first aspect of the invention, there is provided a method for determining a preferred control strategy relating to control of a manufacturing process for manufacturing an integrated circuit on a substrate, the method comprising: obtaining process data associated with a layout of said integrated circuit across the substrate and/or a process window associated with a feature comprised within the integrated circuit; obtaining a plurality of candidate control strategies configured to control the manufacturing process based on the process data and on cost metric data, said cost metric data being associated with a required metrology effort needed for each candidate control strategy out of said plurality of candidate control strategies; determining quality metric data comprising a quality metric associated with the yield of the manufacturing process for each candidate control strategy; and selecting a preferred control strategy, using a computer system, based on the determined quality metric data and associated cost metric data for each candidate control strategy.

In a second aspect of the invention, there is provided a computer program comprising program instructions operable to perform the method of the first aspect when run on a suitable apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which:

FIG. 4 is a flowchart describing an automated method for selecting an optimal control strategy.

DETAILED DESCRIPTION

Before describing embodiments of the invention in detail, it is instructive to present an example environment in which embodiments of the present invention may be implemented.

Figure 1:
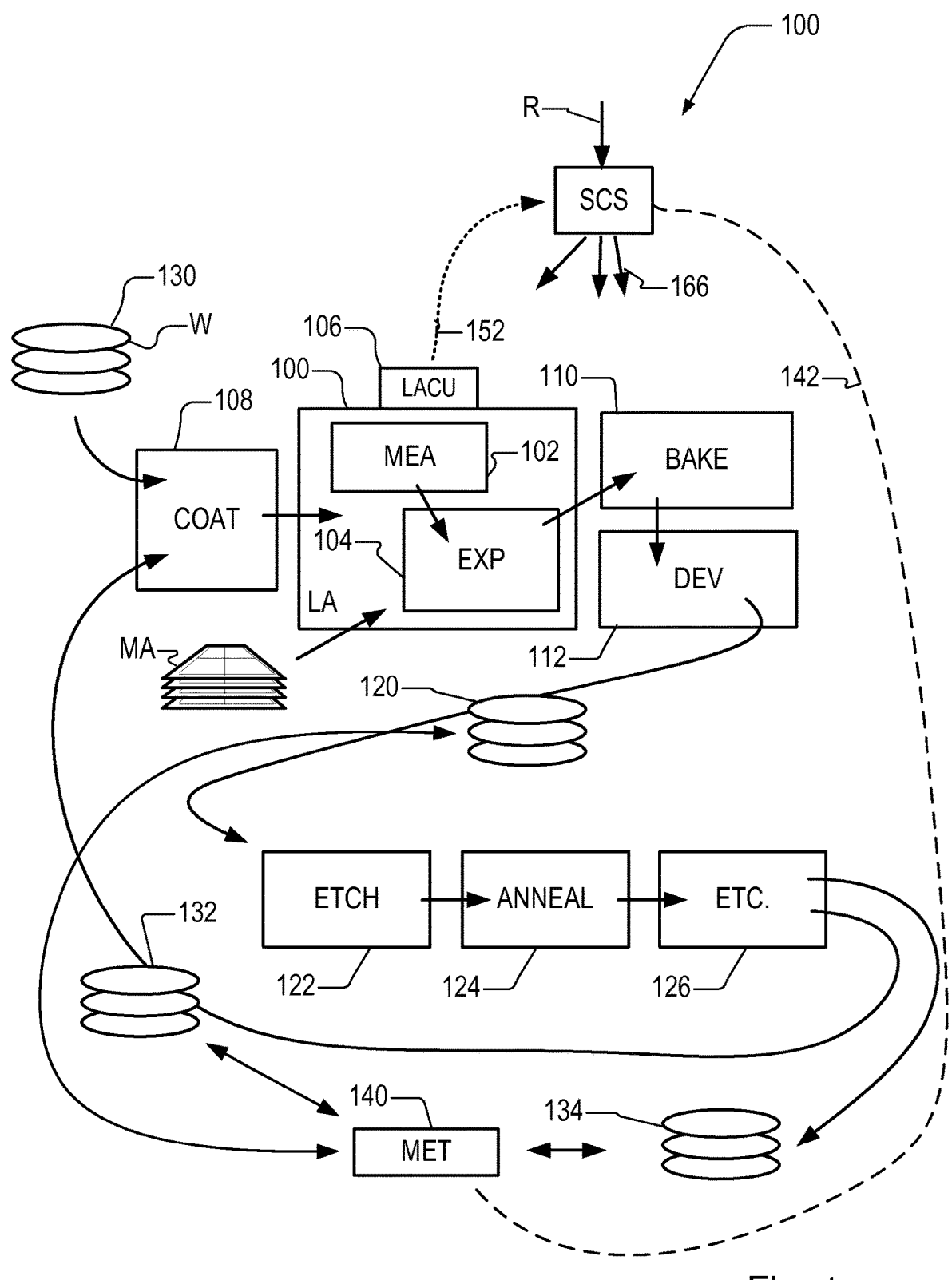
FIG. 1 depicts a lithographic apparatus together with other apparatuses forming a production facility for semiconductor devices.

FIG. 1 at 100 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out.

The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. The metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work.

Additionally, metrology apparatus 140 and/or other metrology apparatuses (not shown) can be applied to measure properties of the processed substrates 132, 134, and incoming substrates 130. The metrology apparatus can be used on the processed substrate to determine important parameters such as overlay or CD.

During or before any actual imaging, the processing parameters may have a perturbation that causes them to deviate out of specification (e.g., outside of the process window; i.e., a space of processing parameters under which a pattern will be produced within specification) and thus may lead to defects. For example, the focus may change due to topography of a substrate to be exposed, drift in the substrate stage, deformation of the projection optics, etc.; the dose may change to due drift in the source intensity, dwell time, etc. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the manufacturing (e.g. lithographic) process are typically based on measurements fed back or fed forward and then modelled using, for example inter-field (across-substrate fingerprint) and/or intra-field (across-field fingerprint) models. This modelling may also be extended to include intra-die models (across-die models), as appropriate. Within a die, there may be separate functional areas such as memory areas, logic areas, contact areas etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each best focus.

Other manufacturing processes may also be controlled in such a manner using suitable models to implement corrections. For example, these may comprise correction of an etch process, reticle correction, correction for a track system, correction for a transient model associated with one or more apparatuses utilized in performing said semiconductor manufacturing process.

The control of the lithographic apparatus may be achieved by modeling a correction profile (e.g., a control profile) for the relevant parameter (or co-optimized for more than one parameter). The modelled correction profile for each parameter is fed into the lithographic apparatus, which actuates the desired correction profile to control the lithographic process (exposure). The control may be based on feed forward models (e.g., from data measured within the lithographic apparatus prior to exposure). The scanner itself has self-correction which needs to be actuated during exposures by the scanner. These self-corrections comprise, for example feed forward models such as reticle heating and wafer heating, machine calibrations such as wafer table shape and layout dependent corrections.

Focus control is an example of a mainly feed forward control loop, based on a large amount of levelling data collected for each substrate which is used to determine corrections for exposure on that substrate which corrects for the surface topography. Other corrections are based on feedback control loops. Focus control may, in addition to the main feed forward control just mentioned, also have a feedback element based on measurement of focus from exposed structures. Overlay control is typically based on a feedback loop; based on measurement of overlay from processed substrates. Dose control has no feed forward control other than for mean dose, and is typically controlled in a feedback loop from post exposure (e.g., after-etch) measurement, via a correction profile determined per field (e.g., separately in the scan and slit directions).

All these sources of corrections are input into the lithographic apparatus, which combines all of the corrections per exposure and actuates them, to optimize overlay, focus, dose and imaging performance. There are a number of methods for the lithographic process to actuate the correction profile e.g., for control of focus/dose and/or overlay. An algorithm, essentially behaving as a filter, transforms the corrections into setpoints for the stages and lens/mirrors. The setpoints are defined as time-dependent trajectories e.g., which define the tilting of the reticle stage and/or wafer stage relative to each other during exposure. By moving accordingly, the actuators image the fingerprint onto the substrate. Such methods and others will be readily apparent to the skilled person and will not be discussed further.

All of the control/correction methods described above have an associated cost, in particular in terms of metrology effort. The degree of control or correction for a typical process is a balance between the quality required and the metrology effort. Typically, increased quality requires better corrections which, in turn, requires increased metrology effort. However, for a manufacturing process to be commercially acceptable, a certain productivity level or throughput target is required to be met and increased metrology effort will tend to reduce productivity/throughput. Currently there is no tool which provides a user with a detailed insight into available options for process control (e.g., in terms of yield, overlay or another parameter). In particular, at present there is no tool for identifying which control option, out of a number of possible control options, is most suitable based on expected improvements associated with the control options, and which may take into account aspects such as metrology cost, purchase cost, etc. Guidance for determining a control strategy which best fits the needs for a particular process is an important step during the setup of a semiconductor manufacturing process. A control strategy is mainly defined by parameters and selection of options chosen in order to achieve a desired control of spatial and temporal variations of a performance parameters (such as overlay, CD and yield). For example a control strategy may be defined by enablement of an option to allow substrate control (wafer level control) and further by a specific selection of alignment marks and overlay model parameters used for determining process corrections. In addition the control strategy may include definitions of options needed to achieve a desired dense spatial control of performance parameters across a substrate, for example the maximum polynomial order of the process correction supported by the interface configured to communicate process correction parameters to a lithographic apparatus.

As such, it is proposed to evaluate different process control strategies and/or identify a preferred process control strategy based on:

Process data: this may include historic data and/or design data which characterizes a semiconductor manufacturing process (typically for applying a series of layers to a substrate such as a wafer). Examples of process data may comprise one or more of:

layout data (e.g., design layout data such as reticle data) describing the layout of features within a particular layer. This may include layout within the die (e.g., the positions and dimensions of different functional areas within the die.

process specification metrics such as process windows which define minimum quality standards such as maximum/minimum allowable values (specification limits) for any parameter (e.g., focus/dose/overlay/edge placement/yield) relevant to the process; process windows may be defined per field, per die, per substrate region and/or per functional area as appropriate. As such, critical structures or functional areas within a die may a more stringent process window associated with them than other structures. Process specification metrics may also include target settings (e.g., best focus settings) for any parameter. Again, these may be set per any of the regions/functional areas as described.

Process context such as: which of the available lithographic apparatuses, etch apparatuses, deposition apparatuses and chambers of mentioned apparatuses were used and/or any settings of these apparatuses, control option settings, sensor readings, product definitions.

Candidate process control strategies to be evaluated and any associated parameter settings required for their implementation; these can be input or determined from the process data.

Quality metric prediction data. This may comprise, for example, knowledge of characteristics of the candidate control strategies and/or any other control strategies (e.g., a strategy of reference) suitable for predicting quality metric data, such as how the control strategies will affect performance when applied to the process characterized by said process data. This could be based on:

historic quality metric data relating to the process (e.g., based on metrology or previous yield determinations) and/or modelled/simulated quality metric data relating to the process.

Associated cost metric data for each candidate control strategy and/or any other control strategies (e.g., a strategy of reference): Examples of cost metrics include:

Required metrology effort. This may comprise a measure of how densely and/or how often measurements should be performed to enable a certain control strategy; e.g., the sampling scheme used. A required metrology type may also be defined. The required metrology type may refer to a measurement technique or a measured parameter. The parameters may include one or more of: overlay metrology, focus metrology, CD (critical dimension)/SWA (side wall angle) metrology. The types of metrology may include:

scatterometry based metrology e.g.:

dark field diffraction based overlay/focus techniques (asymmetry techniques), reconstruction based techniques (e.g., from pupil images), scanning electron microscopy, inline metrology vs. offline metrology (e.g., requirement for inline metrology may be attributed a higher cost)

lithographic apparatus (scanner) metrology:

alignment metrology and/or leveling metrology

Other overheads required to implement each candidate control strategy; e.g., required hardware and software and any associated costs (e.g., software licensing costs, hardware costs) associated therewith.

The candidate process control strategies may relate to the settings of and/or correction for any parameter relating to the manufacturing process. These may include (variable) parameters of any apparatus involved (directly or indirectly) in the manufacturing process, such as lithographic apparatus settings (e.g., focus settings, dose settings, stage positioning setpoints); etching apparatus settings, deposition apparatus settings, track apparatus settings, reticle manufacture and/or reticle lithography settings etc. The candidate process control strategies may also relate to a characteristic of a control interface.

The candidate process control strategies may relate to the model used; e.g., types of modeling strategies, e.g., the order (model degree) of any modeling strategy (e.g. first order/higher order), whether the modeling is per-lot, intra-lot, inter-field, intra-field, inter-die, intra-die and any other relevant model details for simulating any of the manufacturing processes (e.g., for determining corrections).

The proposed process determines a preferred control strategy from a selection of candidate control strategies, such that the preferred control strategy delivers acceptable performance (e.g., in terms of yield or any other quality metric associated with yield such as overlay, CD, Edge Placement Error (EPE), focus and dose) and requires acceptable metrology effort. Other overheads may be taken into account, in addition to metrology effort: for example the required availability of software functionality (licensing costs) or hardware availability may also be evaluated in the preferred control strategy determination. The preferred control strategy may take into account whether quality or metrology time is prioritized, provided minimum standards for both are met.

Therefore, a method for determining a preferred control strategy is disclosed. In an embodiment, the method comprises: obtaining process data associated with performance and/or design data of a semiconductor manufacturing process; determining an expected performance and cost for a plurality of candidate control strategies configured to control the semiconductor manufacturing process based on: a) the process data, b) characteristics of individual control mechanisms comprised within each control strategy, and c) the cost metrics: e.g., a required metrology effort and/or availability of software components associated with each candidate control strategy.

Also disclosed, in an embodiment, is a software product which comprises an interface which interfaces to process data, the process data being associated with performance and/or design information of a semiconductor manufacturing process; and a calculation engine configured to apply a plurality of candidate control strategies to the process data so as to evaluate their (expected) performance and cost. From this evaluation a preferred/selected control strategy may be selected from the plurality of candidate control strategies.

In an embodiment, the cost associated for each candidate control strategy may be calculated based on a cost function having one or both of the following arguments: metrology effort needed to facilitate a control strategy, and other overheads such as cost of software and/or hardware components needed to enable a control strategy. Metrology effort may be measured in metrology time as this affects throughput. This will depend on the number of measurements made: i.e., measurement density and/or measurement frequency. With regard to other overheads, a control strategy may require a particular simulation approach, which in turn may require software having an associated cost (such as software licensing cost) or dedicated processor hardware. Similarly a control strategy may require additional metrology effort which not only adds metrology time, but requires an additional apparatus (e.g., a scanning electron microscope apparatus) with associated additional cost. These additional costs can also be factored into the appropriate cost function.

A user interface (e.g., graphical or textual user interface) may be provided for communicating the preferred control strategy to the user. The user interface may convey evaluation information relating to the preferred control strategy and/or one or more of the other candidate control strategies. For example, the evaluation information may comprise one or more of: a required metrology effort to implement the control strategy, an expected performance of the semiconductor manufacturing process performed according to the control strategy (for example an expected yield should the control strategy be adopted); and an expected stability of the semiconductor process according to the control strategy.

The user interface may further enable addition of one or more further candidate control strategies, for evaluation and/or enable modification/amendment of any of the candidate control strategies being evaluated (e.g., enable modification of the process settings and/or required metrology settings relating to one or more of the plurality of candidate control strategies). Process settings which may be modified in this manner may comprise, for example, one or more of: a model utilized in data processing, a sampling scheme layout, a metrology type, a characteristic of a control interface.

The user interface may be configured to communicate a graph of expected performance of the semiconductor manufacturing process versus a metrology characteristic needed to achieve the expected performance for at least the preferred control strategy, and possibly for one or more of the other candidate control strategies. The metrology characteristic may be one or more of: metrology effort (e.g., measurement density—i.e., the number of measurement locations per lot/per number of substrates/per substrate/per field/per die or per region- and/or measurement frequency), metrology sampling scheme, metrology type, metrology measurement time.

Figure 2:
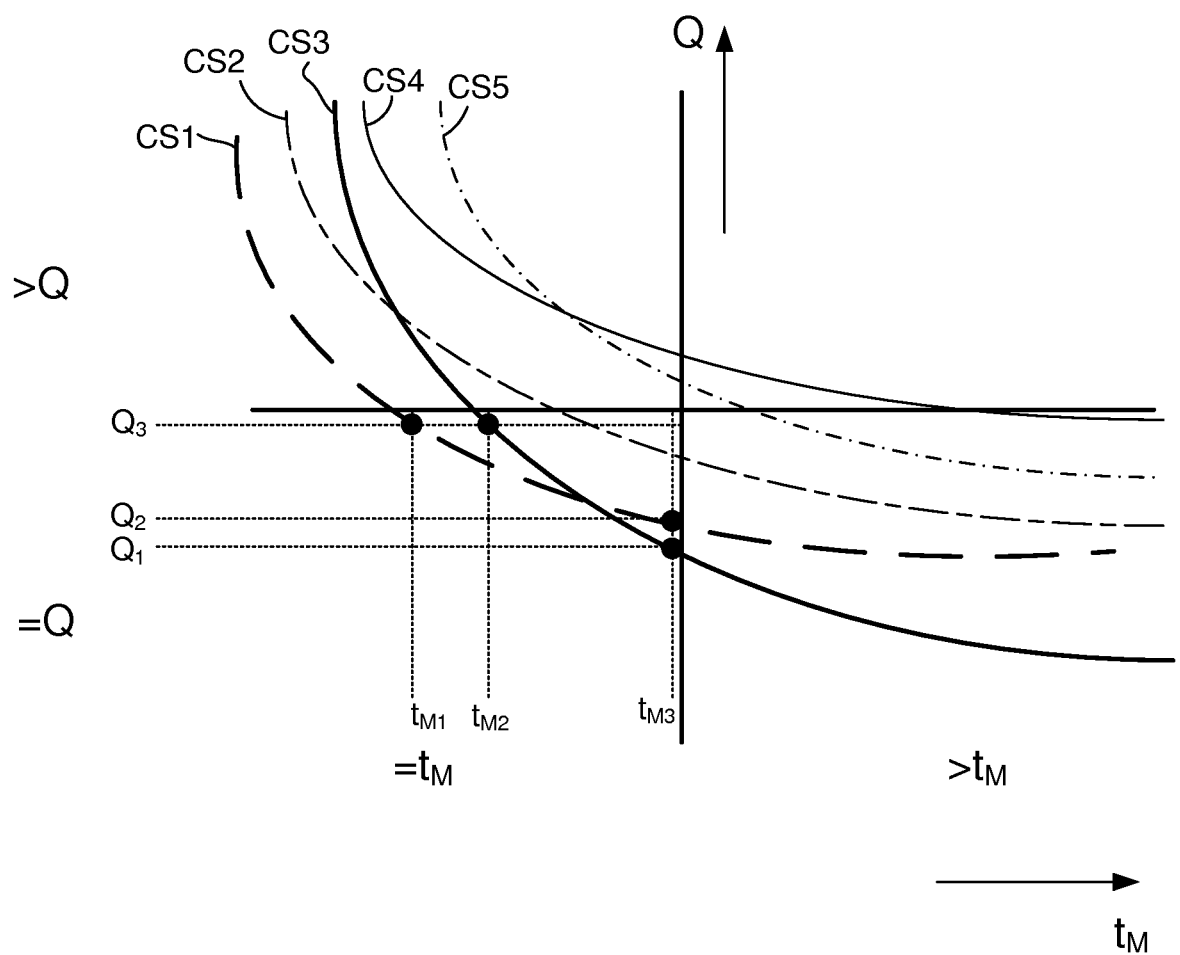
FIG. 2 illustrates a graph which may be an output of a method according to an embodiment, comprising a quality metric Q on the y-axis (where higher values indicate lower quality) and metrology time $T_M$.

FIG. 2 illustrates such a graph which may be an output of a method according to an embodiment. The graph shows a quality metric Q on the y-axis (where higher values indicate lower quality) and metrology time $T_M$ (or other metrology effort metric) on the x-axis. The graph is divided into four quadrants. The bottom-left quadrant is the quadrant of interest where both the quality metric and metrology time specifications are met (i.e., quality and metrology are acceptable). The top-left quadrant relates to a solution space for which the metrology time specification is met, but the quality metric specification is exceeded (i.e., the quality is insufficient). The bottom-right quadrant relates to a solution space for which the quality metric specification is met, but the metrology time specification is exceeded. The top-right quadrant relates to a solution space for which neither quality nor metrology time metrics are met. The graph shows five curves CS1-CS5, each relating to a corresponding control strategy, e.g., candidate control strategies being evaluated. One or more of the curves may also relate to a strategy of reference.

It can be seen that curves CS1, CS2 and CS3 relate to candidate control strategies which meet both quality and metrology time specifications for at least a portion of the curve. Curves CS4 and CS5 do not pass through the bottom-left quadrant and therefore can be discounted for further consideration or evaluation (at least without amendment to the corresponding strategy). As already mentioned, decision on a preferred control strategy may take into account whether quality of metrology time is prioritized, provided minimum standards for both are met. An example of this may be deciding between the control strategies represented by curves CS1, CS2 and CS3. Should a high quality be prioritized, then the control strategies represented by CS3 may be preferred as these enables the highest quality metric $Q_1$ to be achieved for an acceptable, although relatively long, associated metrology time $t_{M3}$. Curve CS1 may be ranked next followed by curve CS2. However, should metrology time be prioritized then the control strategy represented by curve CS1 may be preferred as this enables the minimum metrology time $t_{M1}$ for an acceptable quality $Q_3$. Curve CS3 may be ranked next followed by curve CS2.

The preferred control strategy may be associated with a required presence of commercial options (e.g., presence of particular software and associated licensing cost/presence of particular hardware). Such an embodiment may comprise selecting one or more commercial options available (e.g., via the user interface). The preferred control strategy may then be determined based on the available commercial options.

The user interface may also enable selection of a subset of the candidate control strategies based on an evaluation thereof, e.g., based on one or more of: required metrology effort, required commercial products offering implementation of one or more control strategies.

The user interface further may also enable filtering or expansion of the process data; e.g., to filter the process data associated with a degree of relevance to the performance of the semiconductor manufacturing process.

The method may comprise a step of determining a control recipe associated with the preferred control strategy. The control recipe may comprise control settings for any aspect of said semiconductor manufacturing process. As such, the control recipe may comprise settings for one or more of: lithographic apparatus (scanner) correction (e.g., stage positioning for overlay and/or focus, dose control, lens heating mitigation etc.), reticle correction, correction of an etch process, correction for a track system, correction for a (e.g. transient) model associated with one or more apparatus utilized in performing the semiconductor manufacturing process.

Figure 3:
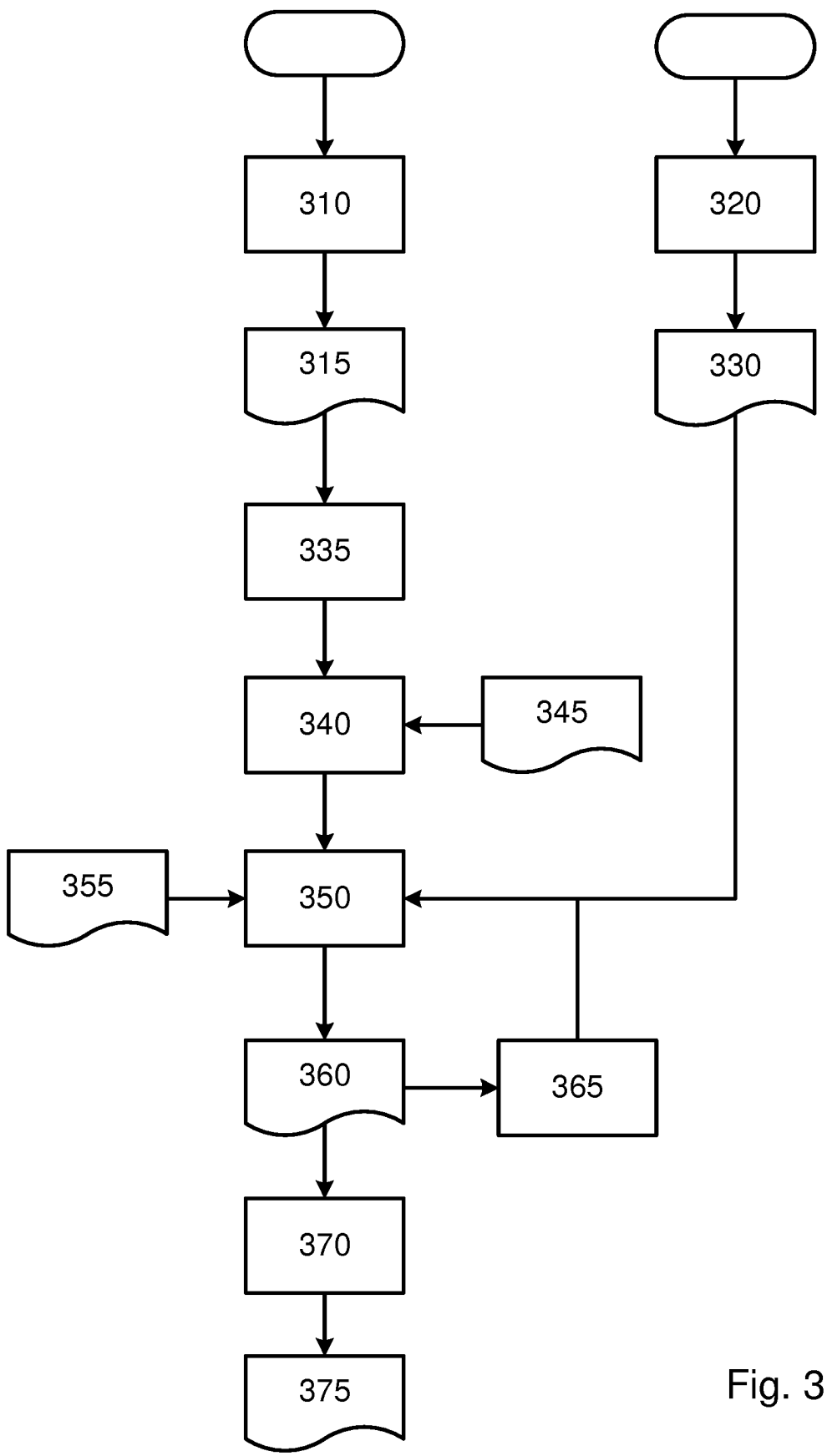
FIG. 3 is a flowchart describing a method according to an embodiment of the invention.

FIG. 3 is a flowchart describing a method according to an embodiment. At step 310, a user starts setup advice for a particular process (e.g., relating to a formation of a layer). This may comprise inputting setup data 315 relevant to the semiconductor manufacturing process, such as layout data (e.g., reticle or design data) etc. At step 320, a user sets quality limits and metrology budget(s) for that process (layer). This may comprise process specification metric data 330 such as process window data, best setting data etc. At step 335, (optionally) a priority is set to prioritize either quality or metrology. This enables the system to provide a single preferred solution, where multiple solutions are available. At step 340, based on the setup data and the process specification metric data, the system proposes a number of candidate control strategies (e.g., scanner and metrology data sets) for setup and qualification. Alternatively or in addition to the system proposing candidate control strategies, candidate control strategies 345 can be input by the user. At step 350, the system evaluates each optimized control strategy, by (for example) calculating a predicted quality metric against metrology time/effort for each control strategy (e.g., using the quality metric prediction data). Optionally, the evaluation takes into account other cost introducing solutions 355, such as: additional license cost (commercial options), additional tooling cost (e.g. after etch metrology) and/or additional setup/lead time cost (e.g. additional setup metrology data needed). Based on the evaluation 350, an output 360 is produced. The output 360 may comprise a preferred control strategy which best meets a quality metric (e.g., yield or overlay for example) for an acceptable metrology effort (and optionally taking into account any quality vs. metrology preference and/or other cost introducing solutions 355). The output 360 may comprise a representation of quality against metrology effort for the preferred control strategy and/or one, some or all of the other candidate control strategies. The output may be configured only to show a select subset of the evaluated control strategies, such as only those which meet a minimum quality threshold and/or metrology effort (or, more generally, cost) threshold, or only a set number of best performing strategies (in terms of quality and/or cost), for example. At step 365, one or more parameters, for example relating to one or more of the candidate control strategies, may be modified or amended, or other candidate control strategies added and the evaluation step 350 repeated. At step 370 a user selects a desired control strategy (e.g., the control strategy identified as preferred or another) and the system generates appropriate control recipes 375 for the selected control strategy.

In an additional embodiment, an improved, automated method for selecting an optimal control strategy will be described. In the above described embodiment, the user manually selects and customizes available control strategies and assesses quality of each control strategy based on evaluation of simulated on-product performance (associated with a certain input data set) and required metrology effort (e.g., throughput impact). However, the number of degrees of freedom in such a control strategy setup is very large. It is simply not feasible to evaluate all available control strategies when the evaluation, selection and customization is largely performed by a user; in fact only a small subset of available control strategies can conceivably be evaluated in such a manner.

Therefore, it is proposed that artificial intelligence (AI) techniques, such as deep learning techniques (e.g., using a neural network) or Bayesian network techniques, are used. In this manner, the proposed control strategy selection method described above can be made more practical, particularly for evaluation of a very large number of control strategies, and user-independent (e.g. user-specific outcome of advice).

It is proposed that the aforementioned process data, cost metric data and quality metric data is used to train an AI network (e.g., neural network or Bayesian network) to relate process data to the quality metric data, taking into consideration the cost metric data. The quality metric data may be simulated or measured, and may relate to (e.g., comprise values of) any one or more suitable quality metrics (e.g., overlay, edge placement error (EPE) critical dimension (CD), CD uniformity (CDU) or yield).

FIG. 4 shows a flowchart describing the steps of such a control strategy optimization method. Training data 400 (which may be a subset of validation data 440) is fed into a neural network 405 (or other suitable AI network). The training data comprises process data (which may comprise any of the examples already provided) and associated quality metric data. For example, the training data may comprise control strategies and resultant quality metric values associated with each control strategy. The training data may also comprise cost metric data, e.g., an associated cost for each control strategy. However, this is not necessary and the cost metric may be taken into consideration by the simulation (e.g., error function 415); for example as a boundary condition or constraint. The neural network 405 may begin as a "blank" untrained network, or else it may have been trained in a calibration phase on other training data (e.g., simulated data). Over time, the neural network 405 will learn which control strategies are better candidates for evaluation, and are more likely to result in acceptable performance (according to the quality metric) and acceptable cost (according to the cost metric).

A simulation phase begins to correlate the process data with the quality metric data. Such methods may be based on modeling of Bayesian networks or machine learning methods (deep learning for example) which relate the process data to quality metric data. The simulation phase may begin with the neural network 405 outputting a candidate control strategy 410. A simulation step 420 comprises evaluating an error function 415 based on the candidate control strategy 410. The error function 415 may model an error (residual) for the quality metric data based on the candidate control strategy 410. This error may be, for example, an average (simulated) quality metric value for the training data. As already mentioned, the error function 415 may be boundary conditioned using cost metric data. At step 430, the error is evaluated (e.g., compared to a threshold; for example is the error or number of non-yielding dies <=0) to determine whether the candidate control strategy 410 is acceptable. If not, this is fed back into the neural network 405, and further candidate control strategies 410 are evaluated. When the error is evaluated as acceptable, an optimized control strategy 435 will be output.

The control strategy optimization method may comprise a validation step 445 using a larger data set; i.e., validation data 440, so as to validate the optimized control strategy 435 against the validation data. The validation step 445 may simply repeat simulation step 420 (i.e., evaluate the error function 415) for the optimized control strategy 435 using the larger volume validation data 440. Optionally, the validation step can also output predicted quality metric values 450 (e.g., predicted overlay or EPE) based on the optimized control strategy 435.

The control strategy optimization method may enable user customization, as with previous examples. For example, the error function (simulation model) may be customized.

The trained neural network 405 can be used to derive an optimized control strategy 435 (options and their settings) based on new input data, instead of requiring the user to evaluate the process performance for a large number of control strategies. The cost metric may be considered as part of the context, e.g., the solution space the method may operate in when deriving the optimized control strategy. This can be achieved by including the cost metric data as part of the training/validation data and/or using the cost metric data to constrain or bound the simulation step 420. The optimized control strategy can be propagated back to the system, associated information (e.g., associated quality metric data) can be gathered and fed again into the neural network 405. In this way, the neural network 405 can continuously evaluate the results and adapt its settings accordingly, and as such can be implemented as a continuous learning system.

Further embodiments of the invention are disclosed in the list of numbered embodiments below:

1. A method for determining a preferred control strategy relating to control of a manufacturing process for manufacturing an integrated circuit, the method comprising:
obtaining process data associated with a design of said integrated circuit;
obtaining a plurality of candidate control strategies configured to control the manufacturing process based on the process data and on cost metric data, said cost metric data comprising associated cost metrics for said candidate control strategies;
determining quality metric data comprising a quality metric related to an expected performance of the manufacturing process for each candidate control strategy; and
selecting a preferred control strategy based on the determined quality metric data and associated cost metric data for each candidate control strategy.

2. A method according to embodiment 1, wherein said cost metric data comprises an associated cost metric for each candidate control strategy which is based on an associated requirement to implement the candidate control strategy 3. A method according to embodiment 2, wherein the associated cost metric for each candidate control strategy is related to a metrology requirement indicative of a required metrology effort to implement each candidate control strategy and/or a cost of one or more components required to implement the candidate control strategy.

4. A method according to embodiment 3, wherein each cost metric is calculated based on a cost function having one or both of the following arguments: said metrology requirement, and said cost of one or more components.

5. A method according to embodiment 3 or 4, wherein said required metrology effort is determined as a function of one or more of: a required metrology sampling scheme, a required metrology type and an estimated required metrology time.

6. A method according to any of embodiments 3 to 5, comprising setting a priority to maximizing quality or minimizing metrology effort and said priority is used in said selection of a preferred control strategy.

7. A method according to any preceding embodiment, wherein the cost of one or more components required to implement the candidate control strategy relates to a licensing, purchasing, running and/or implementation financial cost of the one or more components.

8. A method according to embodiment 7, wherein the one or more components comprises one or more software components.

9. A method according to any preceding embodiment, wherein said selecting step is based on an evaluation step evaluating each of the candidate control strategies based on the determined quality metrics and the cost metric data for each candidate control strategy.

10. A method according to embodiment 9, wherein the step of determining a quality metric and said evaluation step is implemented using an artificial intelligence network.

11. A method according to embodiment 10, wherein the artificial intelligence network comprises a neural network.

12. A method according to embodiment 10 or 11, comprising training the artificial intelligence network using training data comprising process data and quality metric data.

13. A method according to embodiment 12, wherein the training data further comprises cost metric data.

14. A method according to embodiment 12 or 13, comprising a validation step to validate the preferred control strategy using validation data, said validation data being greater in volume than said training data.

15. A method according to embodiment 14, wherein the training data is a subset of said validation data.

16. A method according to any of embodiments 10 to 15, wherein the artificial intelligence network outputs said candidate control strategies, and said evaluation step further comprises evaluating the effect of each of said candidate control strategies on said quality metric.

17. A method according to embodiment 16, wherein said evaluation step comprises determining whether the quality metric data associated with each candidate control strategy is acceptable; and selecting the preferred control strategy based on whether the quality metric data is determined to be acceptable and on the associated cost metric data.

18. A method according to any of embodiments 10 to 17, wherein the evaluation step is implemented by minimizing an error function for the quality metric.

19. A method according to any of embodiments 9 to 18, wherein the evaluation is based on a consideration of variation of the quality metric against the cost metric for each candidate control strategy.

20. A method according to embodiment 19, comprising outputting said variation of the quality metric against the cost metric for at least the preferred candidate control strategy.

21. A method according to embodiment 20, wherein the output is presented graphically.

22. A method according to embodiment 20 or 21, comprising outputting said variation of the quality metric against the cost metric for a subset of the candidate control strategies selected based on said evaluation.

23. A method according to embodiment 20, 21 or 22, wherein said output also comprises required components to implement each candidate control strategy.

24. A method according to any of embodiments 9 to 23, comprising:
    enabling:
    amendment or removal of one more of the candidate control strategies,
    inclusion of one more additional candidate control strategies, and/or
    amendment of one or more models for determining the quality metric data; and repeating said evaluation step.

25. A method according to any preceding embodiment, further providing a control recipe associated with the preferred control strategy.

26. A method according to embodiment 25, wherein the control recipe may comprise settings for one or more of: lithographic apparatus correction, reticle correction, correction of an etch process, correction for a track system, correction for a model associated with one or more apparatus utilized in performing the semiconductor manufacturing process.

27. A method according to any preceding embodiment, wherein said determining a quality metric is further based on characteristics of individual control mechanisms comprised within each candidate control strategy.

28. A method according to any preceding embodiment, wherein said process data further comprises process specification metrics which define process bounds and/or target values for one or more parameters of the manufacturing process.

29. A method according to embodiment 28, wherein said process specification metrics are defined per functional area for at least a subset of said one or more parameters of the manufacturing process.

30. A method according to any preceding embodiment, wherein said quality metric comprises a measure of maximal yield.

31. A method according to any preceding embodiment, comprising determining said plurality of candidate control strategies based on said process data.

32. A computer program comprising program instructions operable to perform the method of any preceding embodiment, when run on a suitable apparatus.

33. A non-transient computer program carrier comprising the computer program of embodiment 32.

Although patterning devices in the form of a physical reticle have been described, the term "patterning device" in this application also includes a data product conveying a pattern in digital form, for example to be used in conjunction with a programmable patterning device.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for determining a preferred control strategy relating to control of a manufacturing process for manufacturing an integrated circuit, the method comprising:
   obtaining process data associated with a layout of the integrated circuit and/or with a process window associated with a feature comprised within the integrated circuit;
   obtaining a plurality of candidate control strategies configured to control the manufacturing process based on the process data and on cost metric data, the cost metric data comprising associated cost metrics for the candidate control strategies;
   determining quality metric data comprising a quality metric related to an expected performance of the manufacturing process for each candidate control strategy; and
   selecting a preferred control strategy based on processing the determined quality metric data by a hardware computer system for each candidate control strategy and processing the associated cost metric data by the hardware computer system for each candidate control strategy.

2. The method as claimed in claim 1, wherein the cost metric data comprises an associated cost metric for each candidate control strategy which is based on an associated requirement to implement the candidate control strategy.

3. The method as claimed in claim 2, wherein the associated cost metric for each candidate control strategy is related to a metrology requirement indicative of a required metrology effort to implement each candidate control strategy and/or a cost of one or more components required to implement the candidate control strategy.

4. The method as claimed in claim 3, wherein the required metrology effort is determined as a function of one or more selected from: a required metrology sampling scheme, a required metrology type and/or an estimated required metrology time.

5. The method as claimed in claim 3, comprising setting a priority to maximizing quality or minimizing metrology effort and the priority is used in the selection of a preferred control strategy.

6. The method as claimed in claim 3, wherein the associated cost metric for each candidate control strategy is related to the cost of one or more components required to implement the candidate control strategy and wherein the cost of one or more components required to implement the candidate control strategy relates to a licensing, purchasing, running and/or implementation financial cost of the one or more components.

7. The method as claimed in claim 3, wherein each cost metric is calculated based on a cost function having one or both of the following arguments: the metrology requirement and/or the cost of one or more components.

8. The method as claimed in claim 1, wherein the selecting is based on an evaluation step evaluating each of the candidate control strategies based on the determined quality metric and the cost metric data for each candidate control strategy.

9. The method according to claim 8, wherein the determining a quality metric and the evaluation step is implemented using an artificial intelligence network.

10. The method according to claim 9, further comprising training the artificial intelligence network using training data comprising at least process data and quality metric data.

11. The method as claimed in claim 10, further comprising validating the preferred control strategy using validation data, the validation data being greater in volume than the training data.

12. The method according to claim 9, wherein the artificial intelligence network outputs the candidate control strategies, and the evaluation step further comprises evaluating the effect of each of the candidate control strategies on the quality metric.

13. The method as claimed in claim 8, wherein the evaluating is based on a consideration of variation of the quality metric against the cost metric for each candidate control strategy.

14. The method as claimed in claim 13, further comprising outputting the variation of the quality metric against the cost metric for the preferred candidate control strategy.

15. The method as claimed in claim 14, wherein the output is presented graphically.

16. The method as claimed in claim 14, wherein the output also comprises required components to implement each candidate control strategy.

17. The method as claimed in claim 8, further comprising:
   enabling:
      amendment or removal of one more of the candidate control strategies,
      inclusion of one more additional candidate control strategies, and/or
      amendment of one or more models for determining the quality metric data; and
   repeating the evaluation step.

18. The method as claimed in claim 1, wherein the determining a quality metric is further based on characteristics of individual control mechanisms utilized within each candidate control strategy.

19. The method as claimed in claim 1, wherein the process data further comprises process specification metrics which define process bounds and/or define target values for one or more parameters of the manufacturing process.

20. The method as claimed in claim 19, wherein the process specification metrics are defined per functional area for at least a subset of the one or more parameters of the manufacturing process.

21. The method as claimed in claim 1, wherein the quality metric comprises a measure of maximal yield.

22. A non-transitory computer program product comprising program instructions therein, the instructions, upon execution by a computer system, configured to cause the computer system to at least:
- obtain process data associated with a layout of an integrated circuit and/or with a process window associated with a feature comprised within the integrated circuit;
- obtain a plurality of candidate control strategies configured to control a manufacturing process for manufacturing the integrated circuit based on the process data and on cost metric data, the cost metric data comprising associated cost metrics for the candidate control strategies;
- determine quality metric data comprising a quality metric related to an expected performance of the manufacturing process for each candidate control strategy; and
- select a preferred control strategy based on computer processing the determined quality metric data for each candidate control strategy and computer processing the associated cost metric data for each candidate control strategy.

* * * * *